United States Patent [19]

Aoki

[11] Patent Number: 5,408,493

[45] Date of Patent: Apr. 18, 1995

[54] APPARATUS AND METHOD FOR ADJUSTING THE OPTICAL AXIS OF A SEMICONDUCTOR LASER APPARATUS

[75] Inventor: Naofumi Aoki, Kyoto, Japan

[73] Assignee: Rohm Co., Ltd., Kyoto, Japan

[21] Appl. No.: 222,580

[22] Filed: Apr. 4, 1994

[30] Foreign Application Priority Data

Apr. 7, 1993 [JP] Japan .................... 5-079950

[51] Int. Cl.6 ............................................ H01S 3/08
[52] U.S. Cl. ............................ 372/107; 372/43; 372/108
[58] Field of Search ............... 372/107, 36, 43, 108, 372/101

[56] References Cited

U.S. PATENT DOCUMENTS

| 4,918,702 | 4/1990 | Kimura ................. 372/34 |
| 5,111,476 | 5/1992 | Hollenbeck et al. ........ 377/107 |
| 5,283,802 | 2/1994 | Hsiung ................. 372/107 |
| 5,335,244 | 8/1994 | Dugan et al. ........... 372/101 |

FOREIGN PATENT DOCUMENTS 0157784 5/1992 Japan .

Primary Examiner—Georgia Y. Epps
Attorney, Agent, or Firm—Nikaido, Marmelstein, Murray & Oram

[57] ABSTRACT

In adjusting the optical axes of a semiconductor laser and an optical system for directing a laser beam emitted by the semiconductor laser, with a system including a plate having an opening and being shiftable parallel to a light receiving surface, and a holder being rotatable while being fitted in the opening, a point image having an excellent characteristic is formed at a predetermined position of the light receiving surface even if the optical axis of the semiconductor laser or the optical axis of the optical system inclines.

4 Claims, 5 Drawing Sheets

APPARATUS AND METHOD FOR ADJUSTING THE OPTICAL AXIS OF A SEMICONDUCTOR LASER APPARATUS

BACKGROUND OF THE INVENTION

1. Field of the Invention

The present invention relates to a system for adjusting the optical axis of a semiconductor laser apparatus, and more specifically, to a system for adjusting the optical axis of a semiconductor laser apparatus by aligning a semiconductor laser and an optical system.

2. Description of the Prior Art

The following is a conventional method for adjusting the optical axis of a semiconductor laser apparatus. First, as shown in FIG. 1, a lens 4 is incorporated into a barrel 3. One surface of the barrel 3 is used as a reference surface PS, which is a plane surface serving as a reference for indicating a position at which a point image of a laser beam LE emitted from a light emitting point LP is formed. The laser beam LE is converged at a position a predetermined distance away from the reference surface PS.

A concave C is formed in a fixing member 1. The concave C is in a predetermined positional relationship with a photosensor 2 fixed to the fixing member 1. The photosensor 2 comprises a light receiving device such as a pin photodiode or a charge coupled device (CCD). A light receiving surface 2a of the photosensor 2 corresponds to a light receiving surface of an apparatus for which the semiconductor laser apparatus of FIG. 1 is actually employed. For example, when the semiconductor laser apparatus is employed in a printer for forming a latent image on a photoreceptor, the surface of the photoreceptor is the light receiving surface. By fitting the barrel 3 in the concave C in such manner that the reference surface PS abuts the inner surface of the concave C as shown in FIG. 1, the reference surface PS and the light receiving surface 2a become parallel to each other, and the position at which the point image is formed coincides with a predetermined position FP on the light receiving surface 2a.

Then, a semiconductor laser 6 is incorporated into a laser holder 5. The laser holder 5 is pushed in the direction of arrow m1 by means of a collet 7 so as to abut the barrel 3 fitted in the fixing member 1. In doing so, a plane FB of the laser holder 5 is brought into contact with a plane FA of the barrel 3. The plane FA is parallel to the reference surface PS.

Then, an alignment in the X and Y directions is performed while signals from the photosensor 2 are being referred to. The alignment is performed by shifting the laser holder 5 in the X and Y directions by means of the collet 7 while the plane FA is in contact with the plane FB. As shown in FIG. 9, the X direction and the Y direction correspond to the minor axis direction and the major axis direction of a far field pattern, respectively, and the Z direction corresponds to a direction vertical to the X-Y plane. The alignment in the Z direction is performed by means of a non-illustrated mechanism.

The laser holder 5 is fixed to the barrel 3 at an optimum position, i.e. at a position which causes an optical axis X1 of the lens 4 and an optical axis X2 of the semiconductor laser 6 to coincide with each other as shown in FIG. 1. This fixing is performed by a spot welding by means of a YAG laser LW. The fixing may be performed by means of an ultraviolet setting adhesive.

However, in this system for adjusting the optical axis of a semiconductor laser apparatus, if the optical axis X1 of the lens 4 or the optical axis X2 of the semiconductor laser 6 is not vertical to the reference surface PS, an optimum point image characteristic cannot be attained only by the alignment in the X and Y directions. That is, the intensity distribution of the point image formed on the photosensor 2 becomes non-uniform. The inclination of the optical axis X1 occurs when the lens 4 incorporated in the barrel 3 is misoriented. The inclination of the optical axis X2 occurs when a laser chip (not shown) die-bonded in the semiconductor laser 6 is inclined or when the semiconductor laser 6 is incorporated in the laser holder 5 improperly.

SUMMARY OF THE INVENTION

An object of the present invention is to provide a system for adjusting the optical axis of a semiconductor laser apparatus 9, with which a point image having an excellent point image characteristic is formed at a predetermined position on a light receiving surface even if the optical axis of a semiconductor laser or the optical axis of an optical system for converging a laser beam inclines. An optical axis adjusting system having this function comprises a barrel for fixing the optical system, an X-Y plate having an opening and being shiftable parallel to a light receiving surface of a photosensor while being in contact with the barrel, and an angle adjusting holder for fixing the semiconductor laser, which is fitted in the opening of the X-Y plate and rotatable while being in contact with the X-Y plate.

When the angle adjusting holder is rotated while being in contact with the X-Y plate, the semiconductor laser fixed in the angle adjusting holder is rotated and the optical axis of the semiconductor laser inclines. Thus, the relative inclination between the optical axes of the semiconductor laser and the optical system is corrected by the rotation of the angle adjusting holder. Moreover, even if a point image is shifted from the predetermined position on the light receiving surface as the angle adjusting holder is rotated, the position shift is corrected by shifting the X-Y plate parallel to the light receiving surface while being in contact with the barrel.

BRIEF DESCRIPTION OF THE DRAWINGS

This and other objects and features of this invention will become more clear from the following description, taken in conjunction with the preferred embodiments with reference to the accompanied drawings in which.

DESCRIPTION OF THE PREFERRED EMBODIMENTS

Hereinafter, an embodiment of the present invention will be described with reference to the drawings. The same elements and portions as those of the conventional system of FIG. 1 are denoted by the same reference designations, and no detailed description thereof will be given.

Figure 2:
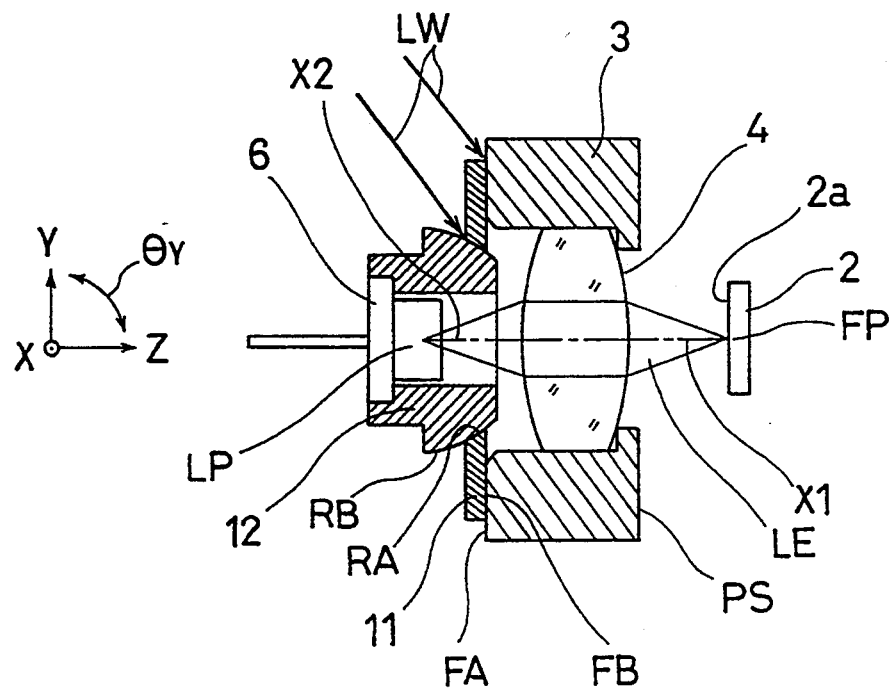
FIG. 2 is a cross-sectional view showing an embodiment of the present invention.
Figure 3:
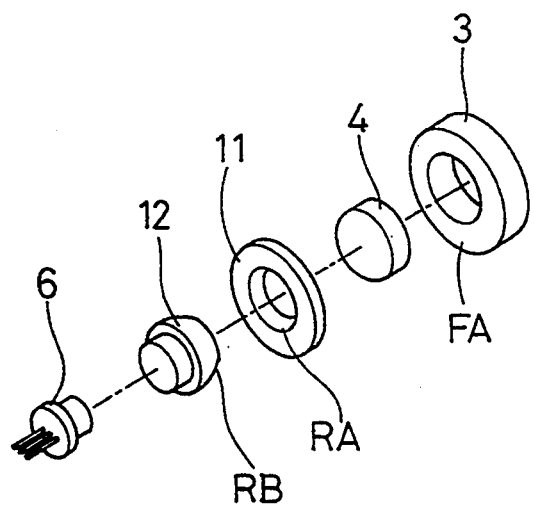
FIG. 3 is an exploded perspective view showing the embodiment of the present invention.

FIG. 2 is a cross-sectional view of a system for adjusting the optical axis of a semiconductor laser apparatus embodying the present invention. FIG. 3 is an exploded perspective view of the system. Similarly to the previously-described conventional system, this embodiment is a system for adjusting the optical axis of a semiconductor laser apparatus by aligning the semiconductor laser 6 and the lens 4 directing the laser beam LE toward the light receiving surface 2a of the photosensor 2 so that a point image is formed at the predetermined position FP on the light receiving surface 2a.

Figure 1:
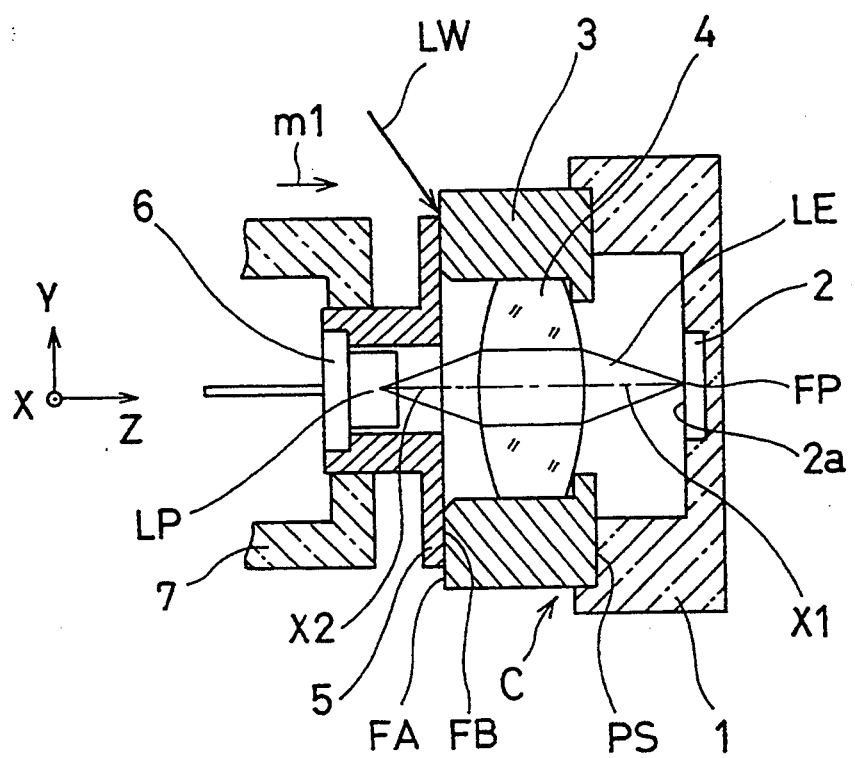
FIG. 1 is a cross-sectional view showing a conventional system.

In this embodiment, the following are provided instead of the laser holder 5 of the conventional system of FIG. 1: an X-Y plate 11 shiftable parallel to the light receiving surface 2a, i.e. in the X and Y directions while being in contact with the barrel 3; and an angle adjusting holder 12 rotatable while being in contact with the X-Y plate 11. The semiconductor laser 6 is fixed in the angle adjusting holder 12. Although the fixing member 1 and the collet 7 are not shown in FIGS. 2 and 3, the photosensor 2 is arranged at a predetermined position on the fixing member 1 and the collet 7 is used to rotate the angle adjusting holder 12 also in this embodiment.

Figure 8:
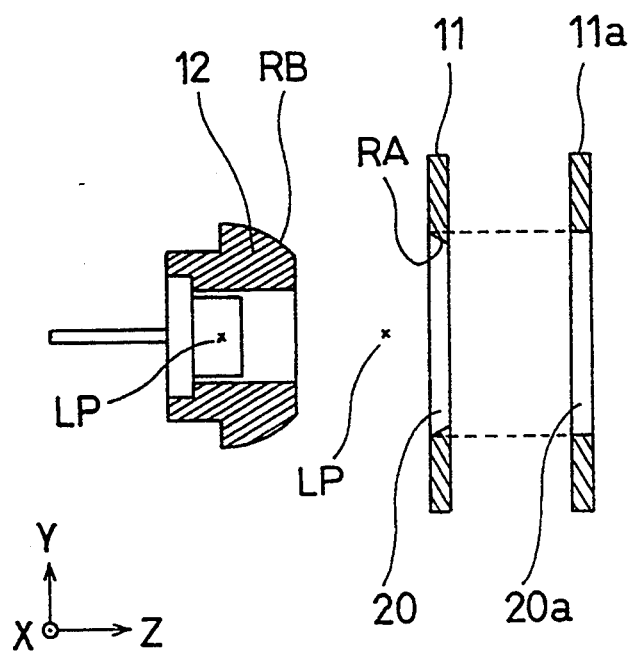
FIG. 8 is a cross-sectional view showing angle adjusting holders and an X-Y plate in the embodiment of the present invention.

Similarly to the laser holder 5 of FIG. 1, the X-Y plate 11 is provided with the plane FB as shown in FIG. 2, A spherical surface RB is formed, as shown in FIG. 8, at a part of the periphery of the angle adjusting holder 12. The spherical center of the spherical surface RB is the light emitting point LP of the semiconductor laser 6. Moreover, the X-Y plate 11 is provided with a spherical surface RA having the same curvature as that of the spherical surface RB. The spherical surface RA is formed by an opening 20 in the X-Y plate 11.

The alignment of the semiconductor laser 6 with respect to the lens 4 in the X and Y directions is performed in the following manner. The angle adjusting holder 12 is fitted in the X-Y plate 11 so that the spherical surface RB abuts the whole of the spherical surface RA of the X-Y plate 11, and the plane FB is brought into contact with the plane FA of the barrel 3. Under this condition, the angle adjusting holder 12 is shifted together with the X-Y plate 11.

Since the spherical surfaces RA and RB have the same curvature, the angle adjusting holder 12 can be rotated about the light emitting point LP while the spherical surface RB is always in contact with the whole of the spherical surface RA. Therefore, when the angle adjusting holder 12 is rotated while being in contact with the X-Y plate 11, the semiconductor laser 6 is also rotated and its optical axis inclines. As a result, the relative inclination between the optical axes X1 and X2 is corrected. Even if the point image is shifted from the predetermined position FP on the light receiving surface 2a as the angle adjusting holder 12 is rotated, the position shift is corrected by shifting the X-Y plate 11 in the X and Y directions while being in contact with the barrel 3.

Thus, even if the optical axes X1 and X2 are inclined, the point image characteristic can be improved while the point image is located at the predetermined position FP. Since the angle adjusting holder 12 is rotated about the center of the light emitting point LP, the light emitting point LP does not shift in the Z direction by the shift of the X-Y plate 11 in the X and Y directions, and consequently, the point image on the light receiving surface 2a does not shift in the Z direction.

Figure 9:
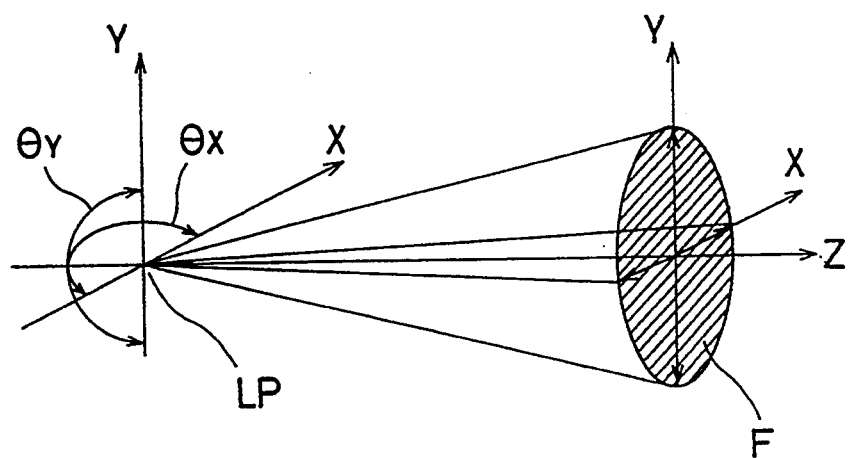
FIG. 9 shows a relationship between directions of the optical axis adjustment and a far field pattern in the embodiment of the present invention and the conventional mechanism.

It is sufficient for an apparatus for the above-described adjustment to have at least the following functions: a function to move the X-Y plate 11 parallelly in the X and Y directions; and a function to rotate the angle adjusting holder 12 in rotation directions along the X-Z and Y-Z planes. The collet provided for this purpose is not shown. The rotation directions along the X-Z and Y-Z planes respectively correspond to rotation directions $\theta_X$ and $\theta_Y$ shown in FIG. 9 with the light emitting point LP as the center.

When the optical axis adjustment is completed, the X-Y plate is fixed to the barrel 3 and the angle adjusting holder 12 is fixed to the X-Y plate 11. That is, all the parts are fixed as shown in FIG. 2 by the spot welding by means of the YAG laser LW.

Figure 4A:
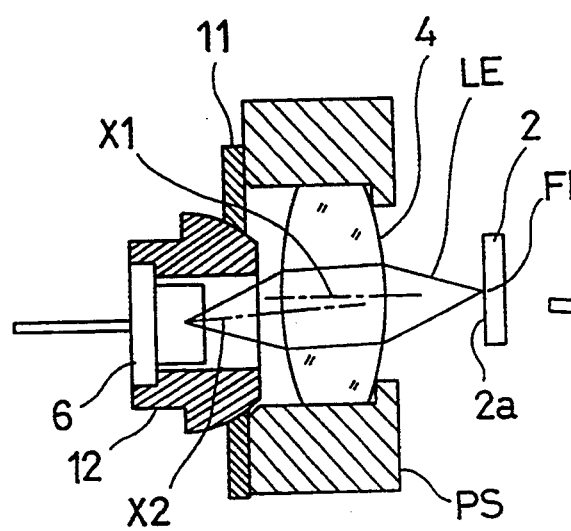
FIGS. 4A and 4B are cross-sectional views showing conditions before and after the optical axis adjustment in the embodiment of the present invention when the optical axis of the semiconductor laser inclines.
Figure 4A:
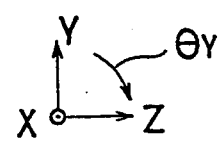
Figure 5A:
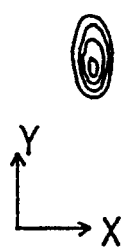
FIGS. 5A and 5B show light intensity distribution of a point image before and after the optical axis adjustment in the embodiment of the present invention when the optical axis of the semiconductor laser inclines.

Subsequently, an alignment will be described for a case where the optical axis X2 of the semiconductor laser 6 inclines. In FIG. 4A, the optical axis X2 inclines in the $\theta_Y$ direction relative to a direction vertical to the reference surface PS, and the point image is located at the predetermined position FP through an alignment only in the Y direction by shifting the X-Y plate 11. Since the optical axis X1 of the lens 4 is vertical to the reference surface PS, the optical axes X2 is inclined relative to the optical axis X1. For this reason, the light intensity distribution of the point image is elliptical as shown in FIG. 5A.

Figure 4B:
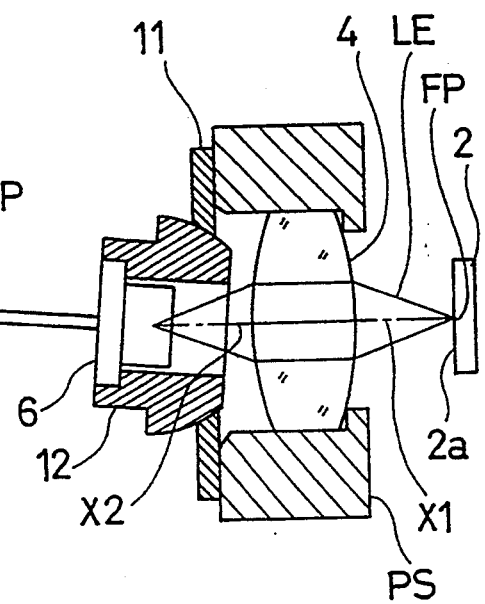
Figure 5B:
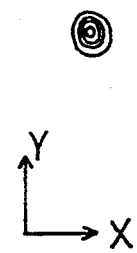

Then, as shown in FIG. 4B, the optical axis X2 is made to coincide with the optical axis X1 through an alignment in the $\theta_Y$ direction by inclining the angle adjusting holder 12 as well as the alignment in the Y direction by shifting the X-Y plate 11. As a result, the light intensity distribution of the point image becomes uniform as shown in FIG. 5B.

Figure 6A:
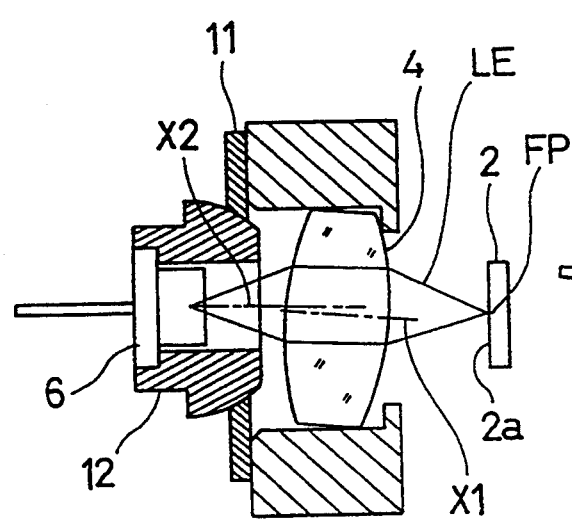
FIGS. 6A and 6B are cross-sectional views showing conditions before and after the optical axis adjustment in the embodiment of the present invention when the optical axis of the lens inclines.
Figure 7A:
FIGS. 7A and 7B show light intensity distribution of a point image before and after the optical axis adjustment in the embodiment of the present invention when the optical axis of the lens inclines.

Subsequently, an alignment will be described for a case where the optical axis X1 of the lens 4 inclines. In FIG. 6A, the optical axis X1 inclines in the $\theta_Y$ direction relative to the direction vertical to the reference surface PS, and the point image is located at the predetermined position FP through an alignment only in the Y direction by shifting the X-Y plate 11. Since the optical axis X2 of the semiconductor laser 6 is vertical to the reference surface PS, the optical axis X2 is inclined relative to the optical axis X1. For this reason, the light intensity distribution of the point image is elliptical as shown in FIG. 7A.

Figure 6B:
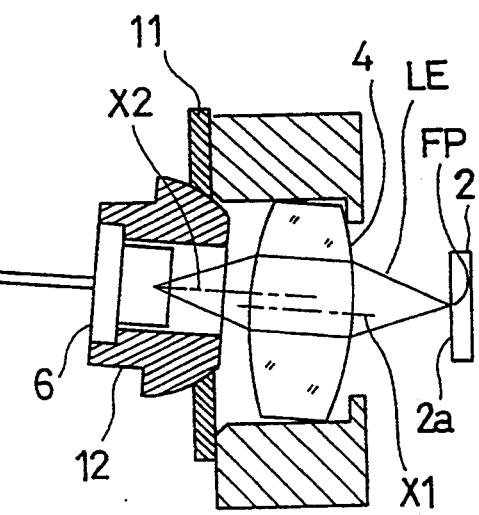
Figure 6B:
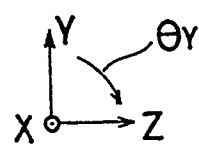
Figure 7B:
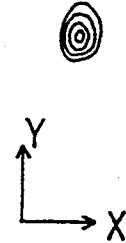

Then, as shown in FIG. 6B, the optical axis X2 is made parallel to the optical axis X1 to conform their directions through the alignment in the $\theta_Y$ direction by inclining the angle adjusting holder 12 as well as the alignment in the Y direction by shifting the X-Y plate 11. As a result, the light intensity distribution of the point image becomes substantially uniform as shown in FIG. 7B. In this case, since the laser beam LE inclines relative to the light receiving surface 2a, the light intensity distribution of the point image is still slightly elliptical.

While in this embodiment, the alignment is performed by rotating the angle adjusting holder 12 in the $\theta_Y$ direction, the alignment by rotating the holder 12 in the $\theta_X$ direction may be performed in a similar manner to the above-described embodiment.

While in this embodiment, the X-Y plate 11 is provided with the spherical surface RA, the X-Y plate does not necessarily have such a spherical surface. For example, the angle adjusting holder 12 may be rotated while the spherical surface RB abuts an edge of an opening 20a whose inner surface has no inclination as shown in FIG. 8. In this case, the X-Y plate is produced at a low cost.

As described above, according to the present invention, since the angle adjusting holder 12 is rotatable while being in contact with the X-Y plate 11, even if the optical axis of the semiconductor laser or the optical axis of the optical system for converging the laser beam inclines relative to a direction vertical to the light receiving surface 2a of the photosensor 2, the relative inclination between the optical axis of the optical system and the optical axis of the semiconductor laser is corrected by inclining the optical axis of the semiconductor laser fixed in the angle adjusting holder 12 by rotating the angle adjusting holder 12. Further, even if the point image is shifted from the predetermined position FP on the light receiving surface 2a as the angle adjusting holder 12 is rotated, since the X-Y plate 11 is shiftable in a direction parallel to the light receiving surface 2a while being in contact with the barrel 3, the shift of the point image on the light receiving surface 2a is corrected by the alignment of the semiconductor laser and the optical system in the parallel direction. Thus, even if the optical axis of the semiconductor laser or the optical axis of the optical system for converging the laser beam inclines, a point image having an excellent characteristic is formed at the predetermined position FP on the light receiving surface 2a.

Obviously, many modifications and variations of the present invention are possible in light of the above teachings. It is therefore to be understood that within the scope of the appended claims, the invention may be practiced other than as specifically described.

What is claimed is:

1. An apparatus for adjusting an optical axis of a semiconductor laser apparatus by aligning a semiconductor laser and an optical system for directing a laser beam from the semiconductor laser to a light receiving surface of a photosensor which senses the laser beam, in such manner that a point image is formed by the laser beam at a predetermined position on the light receiving surface, said adjusting apparatus comprising:

a first member for fixing the optical system thereto;

a second member shiftable parallel to the light receiving surface while being in contact with the first member; and a third member for fixing the semiconductor laser thereto, said third member being rotatable while being in contact with the second member.

2. A semiconductor laser apparatus comprising:

a semiconductor laser;

an optical system for converging a laser beam emitted by the semiconductor laser;

an optical system holding member having a plane end surface and a through hole for fixing the optical system therein;

an opening plate having a circular opening, said opening plate being arranged to abut the end surface of the optical system holding member; and a semiconductor holding member for holding the semiconductor laser therein, wherein an outer surface around a laser beam exit of said semiconductor holding member is a spherical surface with a light emitting point of the semiconductor laser as a center and wherein said outer surface is fitted in the opening of the opening plate.

3. A semiconductor laser apparatus according to claim 2, wherein an inner surface of the opening of the opening plate has a same curvature as a curvature of the spherical surface of the semiconductor holding member.

4. A method of adjusting an optical axis of a semiconductor laser apparatus comprising a semiconductor laser, an optical system for converging a laser beam emitted by the semiconductor laser, an optical system holding member having a plane end surface and a through hole, an opening plate having a circular opening, and a semiconductor holding member whose outer surface around a laser beam exit is spherical, wherein the optical system is fixed in the through hole of the optical system holding member, the semiconductor laser is fixed in the semiconductor holding member in such manner that a light emitting point of the semiconductor laser coincides with a center of a sphere forming the outer surface, the opening plate is arranged to abut the end surface of the optical system holding member, the outer surface of the semiconductor holding member is fitted in the opening, and thereafter an optical axis of the semiconductor laser and an optical axis of the optical system are adjusted by a rotational movement of the semiconductor holding member and a translational movement of the opening plate.

* * * * *